US 9,198,331 B2

(12) United States Patent
Roy

(10) Patent No.: US 9,198,331 B2
(45) Date of Patent: Nov. 24, 2015

(54) DATA CENTER FACILITY DESIGN CONFIGURATION

(71) Applicant: Switch Communications Group LLC, Las Vegas, NV (US)

(72) Inventor: Rob Roy, Las Vegas, NV (US)

(73) Assignee: Switch, LTD., Las Vegas, NV (US)

( * ) Notice: Subject to any disclaimer, the term of this patent is extended or adjusted under 35 U.S.C. 154(b) by 201 days.

(21) Appl. No.: 13/815,911

(22) Filed: Mar. 15, 2013

(65) Prior Publication Data
US 2014/0268530 A1 Sep. 18, 2014

(51) Int. Cl.
*H05K 7/20* (2006.01)

(52) U.S. Cl.
CPC .................................. *H05K 7/20745* (2013.01)

(58) Field of Classification Search
CPC ............. H05K 7/20; H05K 7/20218–7/20381;
H05K 7/20409–7/20418; H05K
7/20009–7/202; H05K 7/1497; H01L 23/473;
H01L 23/367–23/3677; H01L 23/46–23/467;
G06F 1/181–1/182
USPC ........................ 361/679.46–679.54, 688–723;
361/676–678; 165/80.1–80.5, 104.33, 185;
174/15.1–15.3, 16.1–16.3, 547, 548;
257/712–722, E23.088; 24/453,
24/458–459; 454/184; 312/236
See application file for complete search history.

(56) References Cited

U.S. PATENT DOCUMENTS

| | | | |
|---|---|---|---|
| 7,187,265 B1 * | 3/2007 | Senogles et al. ............... 340/3.5 |
| 7,881,910 B2 * | 2/2011 | Rasmussen et al. ............. 703/1 |
| 8,072,780 B1 * | 12/2011 | Roy ............................. 361/825 |
| 8,180,495 B1 * | 5/2012 | Roy .............................. 700/278 |
| 8,276,397 B1 * | 10/2012 | Carlson et al. ............... 62/259.2 |
| 2007/0105445 A1 * | 5/2007 | Manto et al. ............. 439/620.09 |
| 2007/0213000 A1 * | 9/2007 | Day .............................. 454/184 |
| 2010/0165565 A1 * | 7/2010 | Hellriegal et al. ........ 361/679.46 |
| 2010/0170277 A1 * | 7/2010 | Schmitt et al. ............... 62/259.2 |
| 2010/0223085 A1 * | 9/2010 | Gauthier et al. .................. 705/8 |
| 2011/0094978 A1 * | 4/2011 | Bailey et al. ................. 211/26.2 |
| 2011/0157829 A1 * | 6/2011 | Wormsbecher et al. ...... 361/701 |
| 2011/0189936 A1 * | 8/2011 | Haspers et al. ............... 454/184 |
| 2011/0239679 A1 * | 10/2011 | Dechene et al. ............. 62/259.2 |
| 2011/0239683 A1 * | 10/2011 | Czamara et al. ............. 62/259.4 |

(Continued)

OTHER PUBLICATIONS

International Search Report issued Aug. 7, 2014 in corresponding PCT/US14/30716.

*Primary Examiner* — Anthony Haughton
*Assistant Examiner* — Razmeen Gafur
(74) *Attorney, Agent, or Firm* — Pillsbury Winthrop Shaw Pittman LLP

(57) ABSTRACT

The methods and apparatuses described herein is a data center. In one embodiment is described a data center comprising: a building having a plurality of rooms and first and second exterior load walls disposed on opposite sides of the building; a plurality of air handler and fluid cooler devices disposed exterior to the building along the first exterior load wall; a plurality of condenser unit devices disposed exterior to the building along the second exterior load wall; a data sector disposed inside the building, adjacent to the first exterior load wall; three separate UPS and substation distribution equipment rooms, each containing UPS and substation distribution equipment therein, as well as air conditioning equipment that is connected to certain of the plurality of condenser unit devices; and a power spine room disposed between the three separate UPS and substation distribution equipment rooms and the data sector, the power spine room including a plurality of PDU devices.

18 Claims, 4 Drawing Sheets

(56) References Cited

U.S. PATENT DOCUMENTS

2012/0031585 A1* 2/2012 Salpeter .................. 165/80.3
2012/0276834 A1* 11/2012 Peng et al. ................ 454/184
2012/0281357 A1* 11/2012 Peng et al. ................ 361/688
2012/0297807 A1* 11/2012 Canney et al. ............. 62/228.4
2012/0300398 A1* 11/2012 Eckberg et al. ............. 361/692
2012/0327592 A1* 12/2012 Godrich et al. ......... 361/679.48
2013/0148291 A1* 6/2013 Slessman ................ 361/679.46

* cited by examiner

DATA CENTER FACILITY DESIGN CONFIGURATION

FIELD OF THE RELATED ART

This application relates generally to data centers, and more particularly to a configuration for a data center.

BACKGROUND

Organizations of all types, such as on-line retailers, Internet service providers, search providers, financial institutions, universities, and other computing-intensive organizations, conduct computer operations from large scale computing facilities. Such computing facilities, often referred to as data centers, house and accommodate a large amount of server, network, and computer equipment to process, store, and exchange data as needed to carry out an organization's operations. Typically, a data center includes many server racks, each of which may include many servers and associated computer equipment. Information Technology (IT) operations are a crucial aspect of most organizational operations. One of the main concerns is business continuity—companies rely on their information systems to run their operations. If a system becomes unavailable, company operations may be impaired or stopped completely. It is necessary therefore to provide a reliable infrastructure for IT operations in order to minimize any chance of disruption.

Further, because a data center may contain a large number of servers that include many electrical components, a large amount of electrical power may be required to operate the facility. The electrical power is distributed to a large number of locations spread throughout the computer room (e.g., many racks spaced from one another, and many servers in each rack), Electronic components in computer systems such as integrated circuits, printed circuit boards, mass storage devices, power supplies, processors, etc, generate excess heat. As an example, computers with multiple processors may generate 250 watts of waste heat. Multiply that figure by several thousand (or tens of thousands) to account for the amount of computers in a large data center, and one can readily appreciate the amount of heat that can be generated. A plurality of larger, multiple-processor computers configured into rack-mounted components within a racking system can generate a substantial amount of waste heat. To remedy this, data centers include mechanisms for waste heat removal from a plurality of racking systems, typically by circulating air through one or more of the rack systems. Many data centers therefore rely on air conditioning systems to maintain the temperature and other environmental conditions in the data center within acceptable limits.

A data center must maintain high standards for assuring the integrity and functionality of its hosted computer environment. This is generally accomplished through robust design and redundancy, including redundancy of processing resources, communication channels, as well as power and emergency backup power generation.

One example of a robust design and redundancy is described in U.S. Pat. No. 8,180,495, assigned to the same assignee as the present invention, and which is incorporated by reference in its entirety. FIG. 1 herein illustrates the configuration of described in the '495 patent of the facility 580, with exterior walls 582, with condenser units 800 and heat expulsion chambers 900 exterior of the facility 580, and data equipment areas 586, with cabinet clusters 590 therein. Power PDUs are located within the equipment area 588, with other equipment in areas 584. While this overall configuration is efficient, further advantageous refinements have been made, which are disclosed herein, though for aspects that are similar, those are apparent and will not be repeated in the disclosure herein.

SUMMARY

The methods and apparatuses described herein is a data center.

In one embodiment is described a data center comprising: a building having a plurality of rooms and first and second exterior load walls disposed on opposite sides of the building; a plurality of air handler and fluid cooler devices disposed exterior to the building along the first exterior load wall; a plurality of condenser unit devices disposed exterior to the building along the second exterior load wall; a data sector disposed inside the building, adjacent to the first exterior load wall; three separate UPS and substation distribution equipment rooms, each containing UPS and substation distribution equipment therein, as well as air conditioning equipment that is connected to certain of the plurality of condenser unit devices; and a power spine room disposed between the three separate UPS and substation distribution equipment rooms and the data sector, the power spine room including a plurality of PDU devices.

BRIEF DESCRIPTION OF THE DRAWINGS

These and other aspects and features will become apparent to those ordinarily skilled in the art upon review of the following description of specific embodiments of the invention in conjunction with the accompanying figures, in which.

DETAILED DESCRIPTION

For the purposes of explanation, numerous specific details are set forth throughout this description in order to provide a thorough understanding. It will be appreciated, however, by persons skilled in the art that the embodiments described herein may be practiced without some of these specific details. In other instances, well-known structures and devices are shown in block diagram form to avoid obscuring the underlying principles of the various embodiments.

Figure 1:
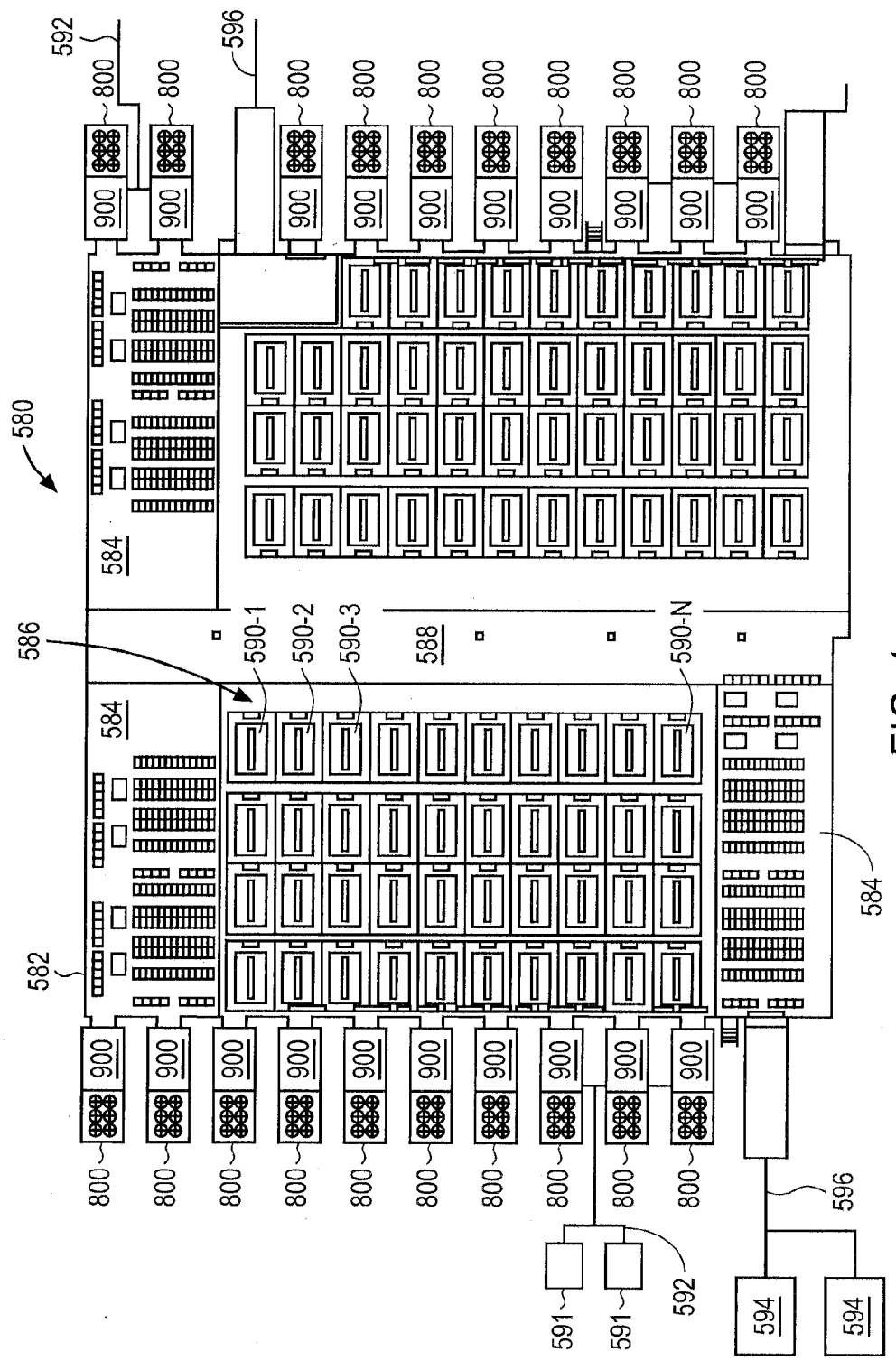
FIG. 1 depicts an example of a prior art data center configuration.
Figure 2:
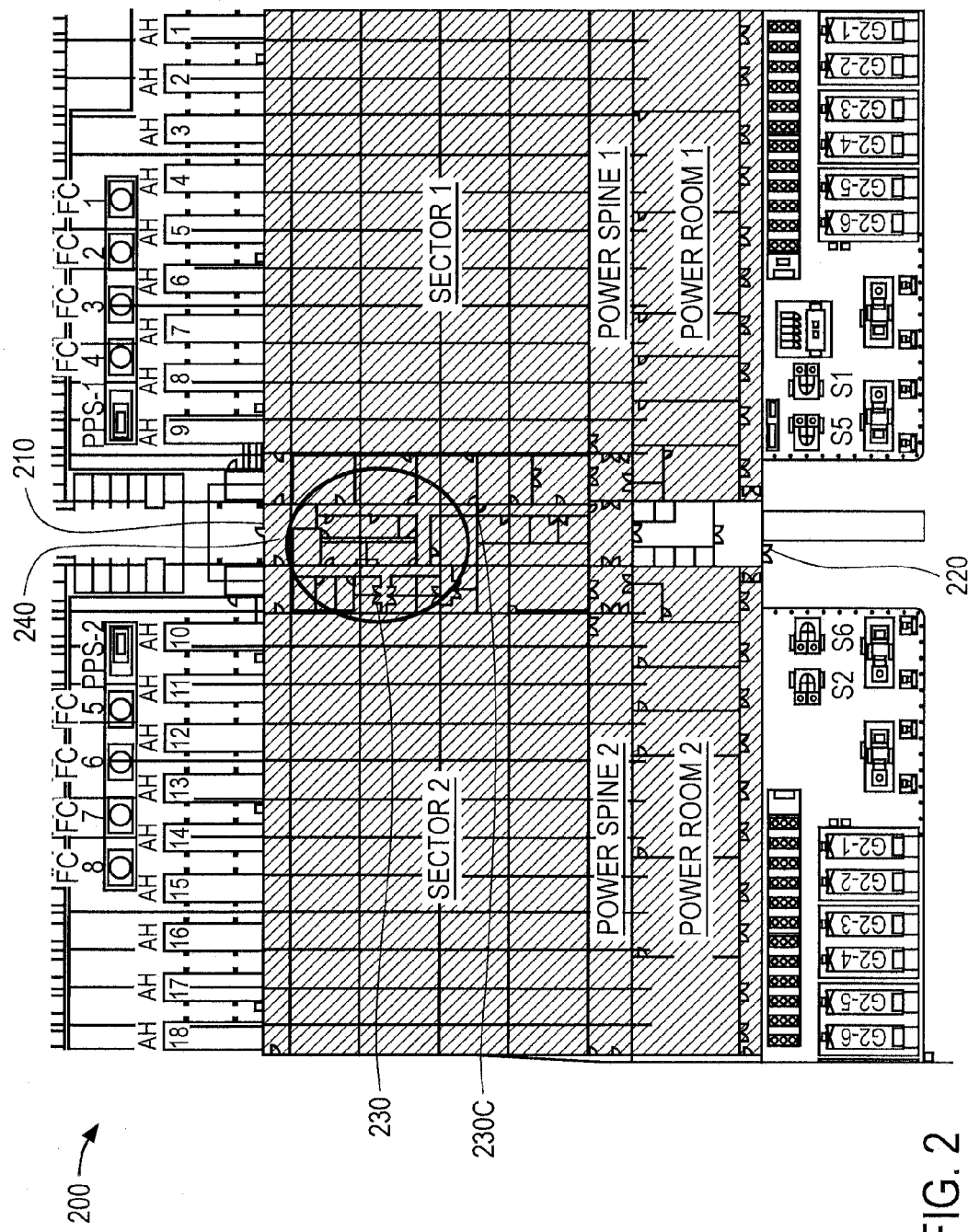
FIG. 2 depicts an overview of a data center configuration according to one embodiment.

The methods and apparatuses described herein include a data center. FIG. 2 depicts an overview of a data center configuration according to one embodiment. As illustrated, the data center 200 includes different rooms, each of which have different intended purposes. It will be apparent from FIG. 2 that in a preferred embodiment there is a symmetric design, in which there is a Sector 1 and a Sector 2, each of which are for the data hall portion of the building that stores a plurality of cabinets of electronic equipment. As is apparent the right portion of the building that includes Sector 1 and the left portion of the building that contains Sector 2 are symmetric about the centerline of the building. As such, the following discussion will focus on Sector 1, with it being understood that the Sector 2 area is identical.

Each of Sector 1, Power Spine 1, Power Room 1 (which has 6 different separately locked rooms therein, as well as the customer entry area 210, the equipment shipping dock 220 and a customer facing conference area 230 are each individual rooms, with no access between them unless through locked doors (including in the corridor marked at 230C), sometime multiple locked doors as indicated, particularly at the secure mantrip 230 through which access to the Sector 1 from the customer entry area 210 can be gained, upon permission from security personnel preferably located in the security entry room 240. Of course access to the entire facility is strictly controlled and any visitor entrance is confined to a single locked door, with one-time exceptions for shipping products received at the shipping dock discussed below that is also locked and monitored. Employee entrance is also through another single locked door.

All entrances, doors, as well as overall areas are further under video surveillance in a preferred embodiment.

It is further noted that each of the each of the 6 different separately locked rooms within Power Room 1 are bounded by reinforced concrete, as within each of these rooms is distribution power equipment. In a failure of the equipment in those rooms, the reinforced concrete walls will protect the data equipment I Sector 1.

It is further noted that above the entire structure is preferably a reinforced roof, as described in U.S. application Ser. No. 13/651,303, the contents of which are expressly incorporated by reference.

Figure 3:
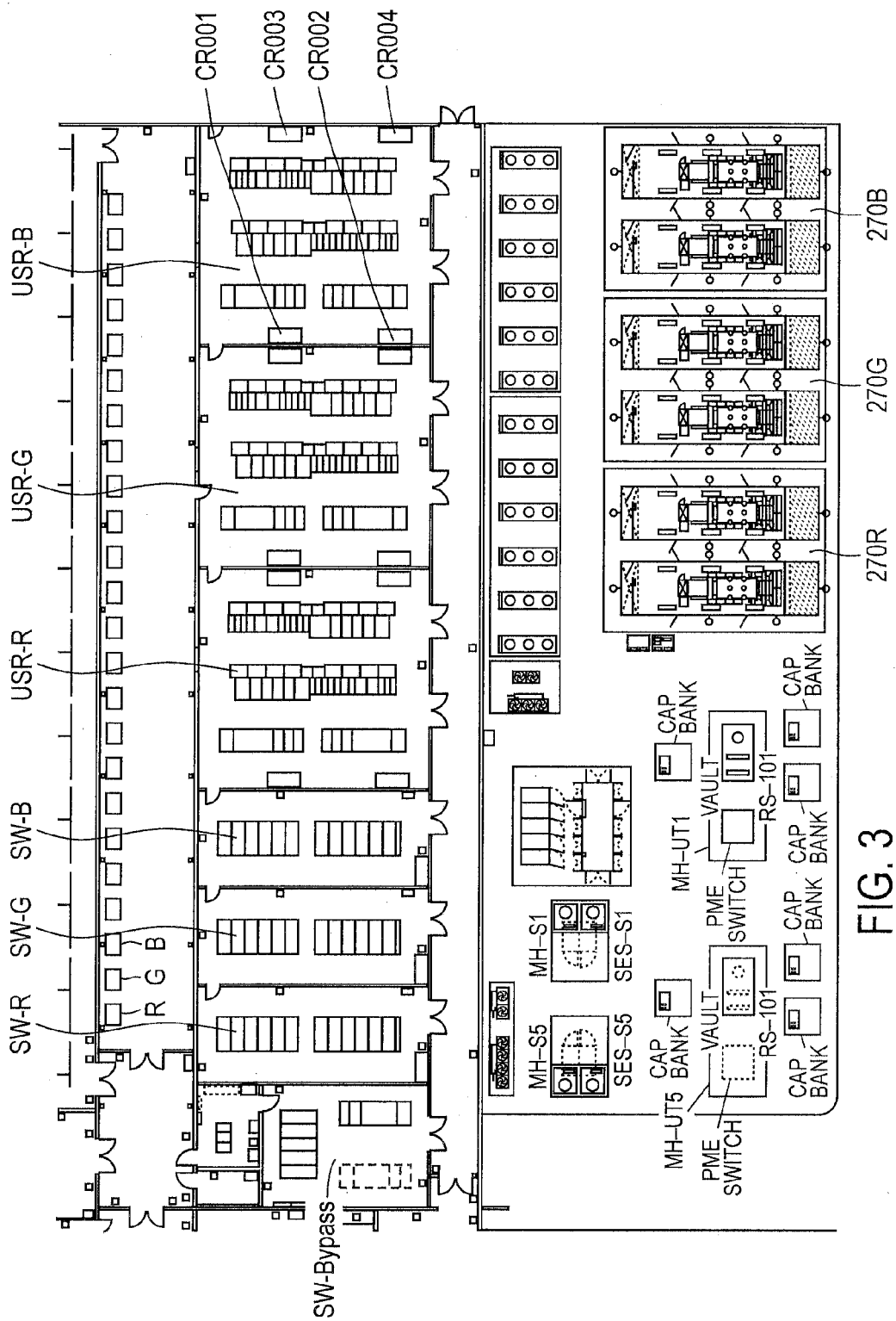
FIG. 3 depicts a more detailed view of a distribution equipment area of the data center configuration set forth in FIG. 2 according to one embodiment.
Figure 4:
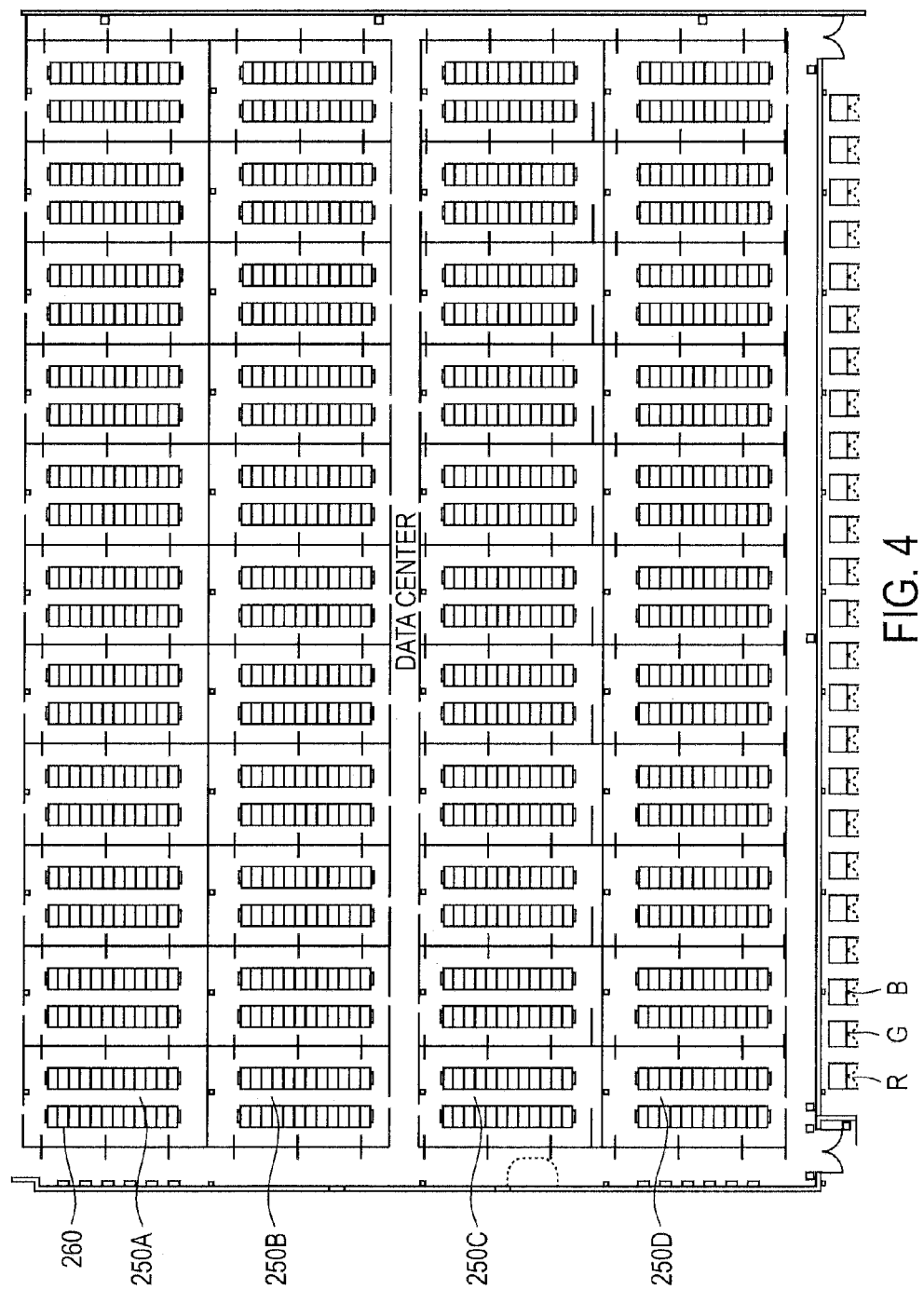
FIG. 4 depicts a more detailed view of a data equipment area of the data center configuration set forth in FIG. 2 according to one embodiment.

It is also noted that within the Sector 1, a more detailed diagram of which is shown in FIG. 4, the preferred design of the room includes the bracket support designs that are taught in U.S. application Ser. No. 13/551,415, the contents of which are expressly incorporated by reference. With respect to running the tri-redundant RGB Power disclosed in FIG. 7B of the '495 patent, using the bracket support design in U.S. application Ser. No. 13/551,415, the power produced from the leftmost three PDU's shown as R, G B in FIG. 4 are all distributed to the cabinet clusters in the overhead manner along the paths 260. As there are 24 PDU's and 12 paths 260 in the preferred embodiment, various arrangements of running 3 redundant PDU transmission lines overhead along each path 260 are possible. Which arrangement to use can vary, such as depending upon the energy consumption of various equipment within each of the cabinet clusters 260. It is apparent that the row of PDU's in FIG. 3 and FIG. 4 are the same as in FIG. 2, though given the smaller size of FIG. 2 they PDU's are not shown there.

Turning back to FIG. 2, and with reference to FIG. 3 which is more detailed diagram of the distribution equipment rooms within Power Room 1, as well as other equipment disposed on the ground level exterior to the building in the preferred embodiment, it is apparent that there are 3 power switching rooms SW-R, SW-G, SW-B, as well as three UPS and substation rooms USR-R, USR-G, USR-B, with the three switching rooms and the three UPS and substation rooms being identical. As such aspect of these rooms will be discussed only with respect to one of them, as it is the same for the other redundant two. It is noted that there is also bypass switching room SW-bypass, which can be used if repairs are needed for equipment in each of switching rooms SW-R, SW-G, SW-B.

As to the switching rooms SW-R, SW-G, SW-B, backup diesel generators (270R, 270G, 270B) exist external to the building. Preferably underground power lines from the backup diesel generators (270R, 270G, 270B) protrude through the floor of each of the switching rooms SW-R, SW-G, SW-B, allowing for the switching in of redundant power if needed.

As to the UPS and substation rooms USR-R, USR-G, USR-B, within each room, in addition to the UPS and substation equipment, are four different CRAC 1-4 air conditioning units, which have their condensers 280 in the exterior of the building, with the coolant running preferably underground into the rooms and into the four different CRAC 1-4 air conditioning units.

In the present design, all of the condenser units FC and air handling units AH are disposed outside of only one exterior wall, though are otherwise the same as described in the '495 patent. This difference, however, along with the Power Spine 1 being along the opposite edge of the Sector 1 is intentional, as this allows the condensers 280 to be located external to the building, but in spaced relation to the CRAC units that are within the UPS and substation rooms USR-R, USR-G, USR-B.

It is noted that while no equipment using water is disposed within the Sector 1 (other than as required by fire regulations), the reason for this is due to the damage that could be caused to the equipment in the cabinet clusters. As to the distribution rooms, however, usage of the CRAC-1-4 units having the external condensers is more efficient due to the high thermal energy generated within them, as well as given the concrete reinforced walls that would ensure that any coolant leakage from a CRAC-1-4 unit is maintained within the UPS and substation room, as there are a minimum number of doors from those UPS and substation rooms to the Power Spine.

Security is another aspect that is significant, and by having different customer areas, distribution equipment areas, as well as cabinet cluster areas, personnel that work on equipment in the various areas (which is of different type and thus requiring different personnel) are maintained in their respective areas Although described with reference to the preferred embodiments thereof, it will be readily apparent to those of ordinary skill in the art that modifications in the form and details of the disclosed embodiments can be made without departing from the spirit and scope thereof. Further, embodiments disclosed herein may include various operations as set forth above, or fewer or more operations; or operations in an order different from the order described. Accordingly, the scope should be judged in terms of the claims which follow as well as the legal equivalents thereof.

What is claimed is:

1. A data center comprising:
    a building having a plurality of rooms and first and second exterior load walls disposed on opposite sides of the building;
    a plurality of air handler and fluid cooler devices disposed exterior to the building along the first exterior load wall;
    a plurality of condenser unit devices disposed exterior to the building along the second exterior load wall;
    a data sector disposed inside the building, adjacent to the first exterior load wall;
    three separate UPS and substation distribution equipment rooms, each containing UPS and substation distribution equipment therein, as well as air conditioning equipment that is connected to certain of the plurality of condenser unit devices; and
    a power spine room disposed between the three separate UPS and substation distribution equipment rooms and the data sector, the power spine room including a plurality of PDU devices.

2. The data center according to claim 1 wherein, within each data sector, is disposed plurality of cabinet clusters adapted for placement of a plurality of rows of cabinets therein that are separated by a hot aisle, each cabinet cluster further including a hot aisle containment chamber that opens into a hot air plenum cavity such that hot air upwardly moves into each of the hot aisles and into the hot air return plenum cavity that is physically separated from the data sector therebelow by a data sector ceiling.

3. The data center according to claim 2 further including an interior frame structure used to suspend each of the hot aisle containment chambers above a corresponding cabinet location surrounding each of the hot aisle containment chambers, wherein the interior frame structure is independent of and not structurally tied to any cabinets located within each cabinet cluster.

4. The data center according to claim 3 wherein the interior frame structure supports a plurality of cooling vents disposed below the data sector ceiling.

5. The data center according to claim 4 wherein the interior frame structure includes a plurality of support brackets, each of the plurality of support brackets mounted to avoid being vertically placed and mounted to the floor within each hot aisle and an area on two opposite sides of each hot aisle where cabinet equipment can be placed.

6. The data center according to claim 5 wherein the interior frame structure includes a plurality of horizontal support brackets disposed above a cabinet height that each intersect a middle hot aisle portion of a plurality of adjacent cabinet clusters.

7. The data center according to claim 6 wherein the interior frame structure includes for each cabinet cluster:
a first plurality of vertical support brackets disposed along each of the two rows, each vertical support bracket being disposed on the floor at one end and assists in supporting the thermal barrier ceiling at another end, wherein the first plurality of vertical support brackets each further support portions of the thermal shield on one side of the first plurality of vertical support brackets at a location above a top of the plurality of cabinets:
a plurality of tiered ladder rack supports, each connected to another side of at least some of the first plurality of vertical support brackets that is opposite the one side, which establish a plurality of different tiers outside of the hot air containment chamber, so that each of the different tiers is adapted to hold the electronic equipment power wires and conduits and the communication wiring, and
a plurality of conduit holders for holding a plurality of the distribution power wires and conduits, each of the plurality of conduit holders connected to another side of at least some of the first plurality of vertical support brackets that is opposite the one side, each of the plurality of conduit holder disposed above the plurality of tiered ladder rack supports, each of the plurality of conduit holders being aligned with other ones of the plurality of conduit holders; and
a second plurality of vertical support brackets disposed in a row, substantially parallel to the two rows, each second vertical support bracket being disposed on the floor at one end and assists in supporting the thermal barrier ceiling at another end, wherein the second plurality of vertical support brackets each further support portions of the cool air ductwork.

8. The data center according to claim 4 wherein the interior frame structure includes for each cabinet cluster:
a first plurality of vertical support brackets disposed along each of the two rows, each vertical support bracket being disposed on the floor at one end and assists in supporting the thermal barrier ceiling at another end, wherein the first plurality of vertical support brackets each further support portions of the thermal shield on one side of the first plurality of vertical support brackets at a location above a top of the plurality of cabinets;
a plurality of tiered ladder rack supports, each connected to another side of at least some of the first plurality of vertical support brackets that is opposite the one side, which establish a plurality of different tiers outside of the hot air containment chamber, so that each of the different tiers is adapted to hold the electronic equipment power wires and conduits and the communication wiring, and
a plurality of conduit holders for holding a plurality of the distribution power wires and conduits, each of the plurality of conduit holders connected to another side of at least some of the first plurality of vertical support brackets that is opposite the one side, each of the plurality of conduit holder disposed above the plurality of tiered ladder rack supports, each of the plurality of conduit holders being aligned with other ones of the plurality of conduit holders; and
a second plurality of vertical support brackets disposed in a row, substantially parallel to the two rows, each second vertical support bracket being disposed on the floor at one end and assists in supporting the thermal barrier ceiling at another end, wherein the second plurality of vertical support brackets each further support portions of the cool air ductwork.

9. The data center according to claim 2 wherein the hot air in the hot air plenum cavity is fed to openings associated with the plurality of air handler and fluid cooler devices disposed exterior to the building, wherein the openings are disposed along and through the first exterior load wall; and
wherein at least one fan located on an opposite wall of the hot air plenum cavity pushes the hot air within the hot air plenum cavity toward the openings in the first exterior load wall.

10. The data center according to claim 2 wherein a plurality of independent roofs are disposed above the hot air plenum cavity.

11. The data center according to claim 1 wherein the power spine completely separates the data sector from the three separate power switching rooms and the three separate UPS and substation distribution equipment rooms.

12. The data center according to claim 11 wherein each of the three separate power switching rooms have a first common wall with the power spine room that has no doors within the common wall.

13. The data center according to claim 12 wherein each of the three separate UPS and substation distribution equipment rooms have a first common wall with the power spine room and wherein only one door exists within the first common wall between the three separate UPS and substation distribution equipment rooms and the power spine room.

14. The data center according to claim 12 wherein the data sector has a common wall with the power spine room that has no doors.

15. The data center according to claim 13 wherein entry into the three separate power switching rooms and the three separate UPS and substation distribution equipment rooms is gained through an access hall disposed between the three separate power switching rooms and the three separate UPS and substation distribution equipment rooms and the second exterior wall.

16. The data center according to claim 1 wherein the air conditioning equipment that is connected to certain of the plurality of condenser unit devices passes coolant therebetween underground.

17. The data center according to claim 1 wherein the power switching equipment for each of three different power circuits is connected to a separate backup generator located exterior to the building and using underground power lines.

18. The data center according to claim 1 wherein the data sector contains no running water other than as required for compliance with fire regulations.

* * * * *